US010608053B2

(12) United States Patent
Li

(10) Patent No.: US 10,608,053 B2
(45) Date of Patent: Mar. 31, 2020

(54) OLED WITH UPCONVERSION LAYER

(71) Applicant: BOE TECHNOLOGY GROUP CO., LTD., Beijing (CN)

(72) Inventor: Yingyi Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 93 days.

(21) Appl. No.: 15/092,342

(22) Filed: Apr. 6, 2016

(65) Prior Publication Data
US 2017/0040385 A1 Feb. 9, 2017

(30) Foreign Application Priority Data

Aug. 3, 2015 (CN) .......................... 2015 1 0483077

(51) Int. Cl.
*H01L 27/32* (2006.01)
*G02B 5/20* (2006.01)
(Continued)

(52) U.S. Cl.
CPC ........ *H01L 27/322* (2013.01); *C09K 11/7773* (2013.01); *G02B 5/201* (2013.01);
(Continued)

(58) Field of Classification Search
CPC ............... H01L 27/322; H01L 27/3211; H01L 27/3244; H01L 51/5253; H01L 51/5284;
(Continued)

(56) References Cited

U.S. PATENT DOCUMENTS

2011/0127509 A1  6/2011  Joo et al.
2012/0064134 A1* 3/2012  Bourke, Jr. ............ A61Q 17/04
                                                      424/401
(Continued)

FOREIGN PATENT DOCUMENTS

CN       1582410 A        2/2005
CN       101457142 B  *   5/2012
(Continued)

OTHER PUBLICATIONS

Kitai, Luminescent Materials and Applications (Wiley, 2008).*
(Continued)

*Primary Examiner* — Peter Bradford
(74) *Attorney, Agent, or Firm* — Kinney & Lange, P.A.

(57) ABSTRACT

The present disclosure provides an OLED display apparatus and a method for producing the same, and a color filter substrate and a method for producing the same. The OLED display apparatus comprises: a TFT array substrate; a luminescent structure layer provided on the TFT array substrate, wherein light emitted from the luminescent structure layer is infrared light; and a light conversion layer located on the luminescent structure layer. The light conversion layer comprises a plurality of pixel areas, each of which is at least provided with three light conversion units, which are a red light conversion unit formed of an upconversion luminescent material emitting red light after stimulation by infrared light, a green light conversion unit formed of an upconversion luminescent material emitting green light after stimulation by infrared light, and a blue light conversion unit formed of an upconversion luminescent material emitting blue light after stimulation by infrared light.

6 Claims, 3 Drawing Sheets

(51) Int. Cl.
   *C09K 11/77*   (2006.01)
   *H01L 51/52*   (2006.01)
   *G02B 1/14*    (2015.01)
   *H01L 51/50*   (2006.01)

(52) U.S. Cl.
   CPC ............ *G02B 1/14* (2015.01); *H01L 51/5012* (2013.01); *H01L 51/5284* (2013.01); *H01L 2251/5369* (2013.01)

(58) Field of Classification Search
   CPC ............... H01L 51/56; H01L 2227/323; H01L 2251/301; H01L 2251/5369; G02B 1/14; G02B 5/201
   See application file for complete search history.

(56) References Cited

U.S. PATENT DOCUMENTS

| | | | | |
|---|---|---|---|---|
| 2012/0120347 A1* | 5/2012 | Takahashi | ................. | C08F 2/48 349/96 |
| 2012/0280144 A1* | 11/2012 | Guilfoyle | .............. | G01J 3/4406 250/458.1 |
| 2014/0152637 A1* | 6/2014 | Fujita | .................... | C07F 15/002 345/211 |
| 2015/0364523 A1* | 12/2015 | Sato | ..................... | H01L 51/502 257/13 |
| 2017/0117444 A1* | 4/2017 | Stoll | ..................... | H01L 33/504 |
| 2017/0317195 A1* | 11/2017 | Zhang | .................... | H01L 21/28 |

FOREIGN PATENT DOCUMENTS

| | | | |
|---|---|---|---|
| CN | 103715225 A | | 4/2014 |
| WO | WO 2013/044200 | * | 3/2013 |

OTHER PUBLICATIONS

First Chinese Office Action dated May 3, 2016 for corresponding Chinese Application No. 201510483077.3.
Chinese Search Report, for Chinese Patent Application No. 201510483077.3, dated Feb. 1, 2016, 13 pages.

* cited by examiner

OLED WITH UPCONVERSION LAYER

TECHNICAL FIELD

The present disclosure relates to the field of display technology, and particularly to an OLED (Organic Light-Emitting Diode) display apparatus and a method for producing the same, and a color filter substrate and a method for producing the same.

BACKGROUND

OLED display apparatuses are a kind of active light-emitting display devices and have excellent characteristics, such as high contrast, small thickness, broad view angle, high response speed, good applicability in flexible panels, wide range of working temperature, and simple structure and production, etc. They have been widely used in the fields of cell phones, PDAs (Personal Digital Assistants), laptops, digital video cameras, DVD (Digital Versatile Disc) players, automobile speakers, televisions, etc.

The structure of a conventional OLED display apparatus mainly comprises: a TFT (Thin Film Transistor) array substrate, a luminescent structure layer provided on the TFT array substrate, and a color filter layer provided on the luminescent structure layer. Here, from the proximal side with respect to the TFT array substrate to the distal side with respect to the TFT array substrate, the luminescent structure layer sequentially comprises: an anode layer, a hole transport layer, a luminescent layer, a hole barrier layer, an electron transport layer, and a cathode layer. The color filter layer typically comprises color resists for three colors of RGB (red, green, and blue), and three monochromatic lights of RGB can be obtained by filtering the light emitted from the luminescent structure layer with the color filter layer.

However, since monochromatic lights are obtained in a manner of filtering with color resists, the color filter layer described above having relatively low light transmittance results in relatively low the display brightness of the OLED display apparatus. At present, the display brightness has been improved in a manner of adding a color resist for W (white) color in the color filter layer. However, addition of the color resist for W (white) color in the color filter layer may result in the reduction of display gamut. In addition, at present, color filter layers have been formed by using quantum dots to allow the light emitted from the luminescent structure layers capable of emitting blue light or ultraviolet light to stimulate the quantum dots in color filter layers, so as to emit monochromatic light of R, G or B. In this way, it is possible to improve display brightness and increase display gamut. However, the quantum dot material has high price and is prone to be oxidized, resulting in increased cost and low stability of display of OLED display apparatuses.

SUMMARY

In order to overcome the defects in the prior art described above, at least one embodiment of the present disclosure provides an OLED display apparatus and a method for producing the same, and a color filter substrate and a method for producing the same. At least one embodiment of the present disclosure is capable of improving the display brightness the OLED display apparatus and increase display gamut with low cost and high display stability.

To achieve the object described above, the following technical solutions may be employed.

The first aspect of the present disclosure provides an OLED display apparatus, comprising: a TFT array substrate; a luminescent structure layer provided on said TFT array substrate, wherein the light emitted from said luminescent structure layer is infrared light; and a light conversion layer located above said luminescent structure layer, wherein said light conversion layer comprises a plurality of pixel areas, each of which is at least provided with three light conversion units, which are a red conversion unit, a green conversion unit, and a blue light conversion unit; and the red light conversion unit is formed of an upconversion luminescent material emitting red light after stimulation by infrared light; the green light conversion unit is formed of an upconversion luminescent material emitting green light after stimulation by infrared light; and the blue light conversion unit is formed of an upconversion luminescent material emitting blue light after stimulation by infrared light.

Preferably, said light conversion layer further comprises a black matrix. Said black matrix defines the areas where each of the light conversion units is located, and is used for separating the light conversion units from each other.

Preferably, said OLED display apparatus further comprises a protective layer located between said light conversion layer and said luminescent structure layer; and a base substrate located on the side of said light conversion layer opposite to said luminescent structure layer.

Preferably, said upconversion luminescent material emitting red light after stimulation by the light emitted from the luminescent structure layer is: an upconversion luminescent material which is formed by sintering with NaF as a base material, $Y^{3+}$, $Yb^{3+}$, and $Ce^{3+}$ as doping materials, and glycine as a sintering agent.

Preferably, said upconversion luminescent material emitting green light after stimulation by the light emitted from the luminescent structure layer is: an upconversion luminescent material which is formed with by sintering NaF as a base material, $Y^{3+}$, $Yb^{3+}$, and $Ho^{3+}$ as doping materials, and citric acid as a sintering agent.

Preferably, said upconversion luminescent material emitting blue light after stimulation by the light emitted from the luminescent structure layer is: an upconversion luminescent material which is formed by sintering with NaF as a base material, $Y^{3+}$, $Yb^{3+}$, and $Tm^{3+}$ as doping materials, and urea as a sintering agent.

Preferably, all of the upconversion luminescent materials which form said red light conversion unit, said green light conversion unit, and said blue light conversion unit are upconversion nanoparticles.

The second aspect of the present disclosure provides a method for producing an OLED display apparatus, comprising: producing a TFT array substrate; forming a luminescent structure layer on said TFT array substrate, wherein the light emitted from said luminescent structure layer is infrared light; and forming a light conversion layer above said luminescent structure layer, wherein said light conversion layer comprises a plurality of pixel areas, each of which is at least provided with three light conversion units, which are a red conversion unit, a green conversion unit, and a blue light conversion unit. In the above, the red light conversion unit is formed of an upconversion luminescent material emitting red light after stimulation by infrared light, the green light conversion unit is formed of an upconversion luminescent material emitting green light after stimulation by infrared light, and the blue light conversion unit is formed of an upconversion luminescent material emitting blue light after stimulation by infrared light.

Preferably, said forming a light conversion layer specifically comprises: forming a black matrix on a base substrate by using a patterning process, wherein said black matrix defines the areas where each of the light conversion units to be formed is located; forming said red light conversion unit, said green light conversion unit, and said blue light conversion unit respectively in the areas defined by said black matrix by using a transfer process, a printing process, or a patterning process to allow said black matrix to separate the light conversion units from each other; and assembling the base substrate with said light conversion layer formed thereon and the TFT array substrate with said luminescent structure layer formed thereon together face to face.

Preferably, it further comprises forming a protective layer on said light conversion layer, after forming said light conversion layer and before assembling.

Preferably, said forming a light conversion layer specifically comprises: forming a black matrix on said luminescent structure layer using a patterning process, wherein said black matrix defines the areas where each of the light conversion units to be formed is located; and forming said red light conversion unit, said green light conversion unit, and said blue light conversion unit respectively in the areas defined by said black matrix by using a transfer process, a printing process, or a patterning process to allow said black matrix to separate the light conversion units from each other.

Preferably, it further comprises forming a protective layer on said luminescent structure layer, after forming said luminescent structure layer and before forming said light conversion layer; and it further comprises covering said light conversion layer with a base substrate, after forming said light conversion layer.

The third aspect of the present disclosure provides a color filter substrate, comprising a base substrate, wherein said color filter substrate further comprises: a light conversion layer provided on said base substrate, wherein said light conversion layer comprises a plurality of pixel areas, each of which is at least provided with three light conversion units, which are a red conversion unit, a green conversion unit, and a blue light conversion unit; and the red light conversion unit is formed of an upconversion luminescent material emitting red light after stimulation by infrared light; the green light conversion unit is formed of an upconversion luminescent material emitting green light after stimulation by infrared light; and the blue light conversion unit is formed of an upconversion luminescent material emitting blue light after stimulation by infrared light.

Preferably, said light conversion layer further comprises a black matrix. Said black matrix defines the areas where each of the light conversion units is located, and is used for separating the light conversion units from each other.

Preferably, said color filter substrate further comprises a protective layer provided on said light conversion layer.

The fourth aspect of the present disclosure provides a method for producing a color filter substrate, comprising: forming a light conversion layer on a base substrate, wherein said light conversion layer comprises a plurality of pixel areas, each of which is at least provided with three light conversion units, which are a red conversion unit, a green conversion unit, and a blue light conversion unit; and the red light conversion unit is formed of an upconversion luminescent material emitting red light after stimulation by infrared light; the green light conversion unit is formed of an upconversion luminescent material emitting green light after stimulation by infrared light; and the blue light conversion unit is formed of an upconversion luminescent material emitting blue light after stimulation by infrared light.

Preferably, said forming a light conversion layer on a base substrate specifically comprises: forming a black matrix on a base substrate by using a patterning process, wherein said black matrix defines the areas where each of the light conversion units to be formed is located; forming said red light conversion unit, said green light conversion unit, and said blue light conversion unit respectively in the areas defined by said black matrix by using a transfer process, a printing process, or a patterning process to allow said black matrix to separate the light conversion units from each other.

Preferably, it further comprises forming a protective layer on said light conversion layer, after forming said light conversion layer.

In the OLED display apparatus and the method for producing the same and the color filter substrate and the method for producing the same provided by the present disclosure, the light emitted from the luminescent structure layer is infrared light, and a light conversion layer is provided above the luminescent structure layer. The light conversion layer comprises a plurality of pixel areas, each of which is at least provided with a red light conversion unit formed of an upconversion luminescent material emitting red light after stimulation by infrared light, a green light conversion unit is formed of an upconversion luminescent material emitting green light after stimulation by infrared light, and a blue light conversion unit formed of an upconversion luminescent material emitting blue light after stimulation by infrared light, and thus the infrared light emitted from the luminescent structure layer can be converted to monochromatic lights of red, green, and blue through the light conversion layer. Since the upconversion luminescent material for forming the light conversion unit is composed of an inorganic matrix and rare earth doping ions mixed therein, the upconversion luminescent material has low price and stable chemical structure, thereby reducing the cost of the OLED display apparatus and improving the display stability thereof. Moreover, since infrared stimulates the upconversion luminescent material to make it directly emit light with high light-emitting brightness and the light emitted from the upconversion luminescent material by stimulation has good light monochromaticity, the display brightness of the OLED display apparatus is improved and the display gamut thereof is increased.

BRIEF DESCRIPTION OF THE DRAWINGS

In order to illustrate the technical solutions in examples of this present invention or in the prior art more clearly, figures required for describing the examples or the prior art will be simply introduced below. It is apparent that the figures described below are merely some examples of the present disclosure, and other figures may be further obtained by ordinary skilled person in the art according to these figures without exerting inventive work.

DETAILED DESCRIPTION

In order to enable the objects, the characteristics, and the advantages of the present disclosure described above to be more remarkably and easily understood, the technical solutions in the examples of the present disclosure will be described clearly and fully below in conjunction with accompanying drawings in examples of the present disclosure. Obviously, the examples described are merely part of the examples of the present disclosure, rather than all of the examples. Based on the examples in the present disclosure, all other examples obtained by those of ordinary skill in the art without performing inventive work belong to the scope protected by the present disclosure.

EXAMPLE 1

Figure 1:
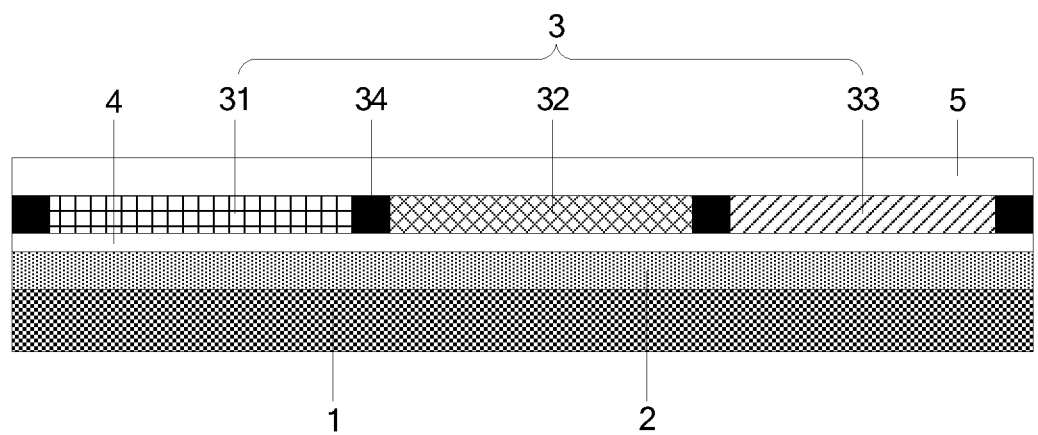
FIG. 1 is a sectional structural diagram of an OLED display apparatus provided by Example 1 of the present disclosure.

This Example provides an OLED display apparatus, and as shown in FIG. 1, this OLED display apparatus comprises: a TFT array substrate 1; a luminescent structure layer 2 provided on the TFT array substrate 1, wherein the light emitted from the luminescent structure layer 2 is infrared light; and a light conversion layer 3 located on the luminescent structure layer 2, wherein the light conversion layer 3 comprises a plurality of pixel areas, each of which is at least provided with three light conversion units, which are a red conversion unit, a green conversion unit, and a blue light conversion unit.

Here, the red light conversion unit 31 is formed of an upconversion luminescent material emitting red light after stimulation by infrared light; the green light conversion unit 32 is formed of an upconversion luminescent material emitting green light after stimulation by infrared light; and the blue light conversion unit 33 is formed of an upconversion luminescent material emitting blue light after stimulation by infrared light.

It is to be first indicated that the upconversion luminescent material is a typical anti-Stokes effect luminescent material and is capable of emitting visible light under the stimulation by infrared light. In the OLED display apparatus described above, the infrared light emitted from the luminescent structure layer 2 passes through the light conversion layer 3. When it passes through the red light conversion unit 31 of the light conversion layer 3, the upconversion luminescent material in the red light conversion unit 31 is stimulated by infrared light and thus emits red light. When it passes through the green light conversion unit 32, the upconversion luminescent material in the green light conversion unit 32 is stimulated by infrared light and thus emits green light. And when it passes through the blue light conversion unit 33, the upconversion luminescent material in the blue light conversion unit 33 is stimulated by infrared light and thus emits blue light. Therefore, the requirements for image display are satisfied. Since the upconversion luminescent material for forming the light conversion unit is composed of an inorganic matrix and rare earth doping ions mixed therein, it has low price and stable chemical structure with respect to quantum dot materials, thereby reducing the cost of the OLED display apparatus and improving the display stability thereof. With respect to color filter structures composed of normal RGBW color resists, the upconversion luminescent material has good monochromaticity of light emission and is favorable to increase the display gamut of the OLED display apparatus. Meanwhile, monochromatic lights are generated at high light-emitting brightness in a manner of light emission by stimulating the upconversion luminescent material with infrared light, and there are no problems that a color filter structure composed of normal RGB color resists has low light transmittance and consequent low display brightness. It is favorable to improve the display brightness of the OLED display apparatus.

In addition, in an existing OLED display apparatus, in which a color filter layer is formed by using quantum dots and a luminescent structure layer capable of emitting blue light or ultraviolet light emits light to stimulate the quantum dots in the color filter layer to emit RGB monochromatic lights, since quantum dots are toxic and prone to be oxidized, quantum dots are required to be encapsulated. However, the encapsulation of quantum dots is relatively difficult, and relatively complex design is required to be made to the interior of the OLED display apparatus. The upconversion luminescent material is used to form the light conversion unit in this Example. Since the upconversion luminescent material is non-toxic, has stable chemical structure, and is scarcely oxidized, the light conversion unit may be formed by using a transfer process, a printing process, or a patterning process, without complex design for encapsulation.

In this Example, the upconversion luminescent materials which form the red light conversion unit 31, the green light conversion unit 32, and the blue light conversion unit 33 may be preferably upconversion nanoparticles. Therefore, the size scale of the material is as fine as nanoscale, which is favorable to improve the monochromaticity of the light emitted by stimulation.

In this Example, particular upconversion luminescent materials which form the red light conversion unit 31, the green light conversion unit 32, and the blue light conversion unit 33 respectively are not limited, as long as they can perform upconversion light emission of respective colors under the stimulation of infrared light. By adjusting the type and the solubility of doped rare earth elements, as well as the matrix material of the upconversion luminescent material, multicolor upconversion light emission can be achieved under the same stimulation light, and the stimulation spectrum thereof covers the entire visible light region.

It is relatively preferable that the upconversion luminescent material emitting red light after stimulation by the light emitted from the luminescent structure layer 2 may be: an upconversion luminescent material which is formed with NaF (sodium fluoride) as a base material, $Y^{3+}$ (trivalent ion of yttrium), $Yb^{3+}$ (trivalent ion of ytterbium), and $Ce^{3+}$ (trivalent ion of cerium) as doping materials, and glycine as a sintering agent, by sintering.

The upconversion luminescent material emitting green light after stimulation by the light emitted from the luminescent structure layer 2 may be: an upconversion luminescent material which is formed with NaF as a base material, $Y^{3+}$, $Yb^{3+}$, and $Ho^{3+}$ (trivalent ion of holmium) as doping materials, and citric acid as a sintering agent, by sintering.

The upconversion luminescent material emitting blue light after stimulation by the light emitted from the luminescent structure layer 2 may be: an upconversion luminescent material which is formed with NaF as a base material, $Y^{3+}$, $Yb^{3+}$, and $Tm^{3+}$ (trivalent ion of thulium) as doping materials, and urea as a sintering agent, by sintering.

It is to be indicated that the OLED display apparatus provided in this Example comprises a plurality of pixels, and each of the pixels comprises at least an R sub-pixel, a G sub-pixel, and a B sub-pixel. The plurality of pixel areas which the light conversion layer 3 comprises correspond to the plurality of pixels described above. The red light conversion unit 31, the green light conversion unit 32, and the blue light conversion unit 33 in the light conversion layer 3 correspond to the R, G, and B sub-pixels.

In order to prevent color mixing between lights of different colors, the light conversion layer 3 may further comprise: a black matrix 1. The black matrix 1 defines the areas where each of the light conversion units is located, and is used for separating the light conversion units from each other. In addition, this black matrix 1 is further used to shield signal lines, such as gate electrode lines, data lines, etc., on the TFT array substrate. The black matrix is a material used to separate three colors of RGB of color filters. The material of the black matrix may be a photoresist comprising a black dye.

In order to prevent the properties of the upconversion luminescent material and the luminescent structure layer 2 in the light conversion layer 3 from being affected due to contamination with each other, a protective layer may be preferably provided between the light conversion layer 3 and the luminescent structure layer 2 to separate them from each other. The protective layer 4 should have high transmittance for infrared light, and the material thereof may be any of various polymers, such as PET (Polyethylene Terephthalate), PBT (Polybutylene Terephthalate), PMMA (Polymethyl Methacrylate), etc.

In order to protect the light conversion layer 3 from being contaminated by impurities in external environment, a base substrate 5 may be preferably provided on the side of the light conversion layer 3 opposite to the luminescent structure layer 2. The base substrate 5 is substantially transparent for visible light. The base substrate 5 may be a plastic substrate, a glass substrate, etc.

Figure 2:
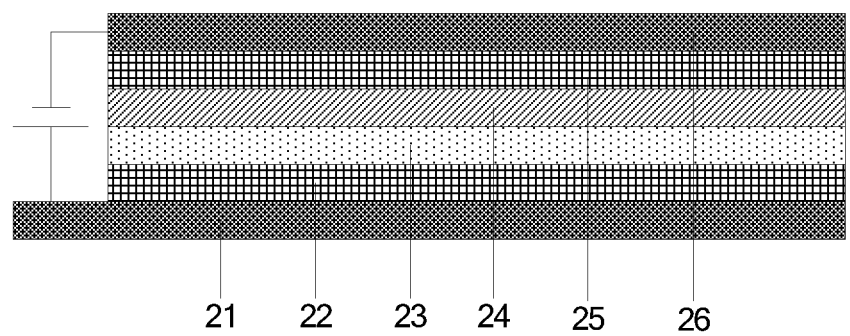
FIG. 2 is a sectional structural diagram of a luminescent structure layer of an OLED display apparatus provided by Example 1 of the present disclosure.

It is to be indicated that the luminescent structure layer 2 in this Example is a laminated structure, and as shown in FIG. 2, from the proximal side with respect to the TFT array substrate to the distal side with respect to the TFT array substrate, the luminescent structure layer 2 comprises: an anode 21, a hole transport layer 22, an infrared luminescent layer 23, a hole barrier layer 24, an electron transport layer 25, and a cathode 26. Holes in the anode 21 pass through the hole transport layer 22 and arrive the infrared luminescent layer 23. Electrons in the cathode 26 pass through the electron transport layer 25 and the hole barrier layer 24 and arrive the infrared luminescent layer 23. Holes and electrons are recombined in the infrared luminescent layer to emit infrared light.

Here, the material which forms the anode 21 may be ITO (Indium Tin Oxide), the material which forms the hole transport layer 22 may be TPD (N,N'-bis(3-methylphenyl)-N,N'-diphenyl-1,1'-biphenyl-4,4'-diamine), NPD (N,N'-bis(1-naphthyl)-N,N'-diphenyl-1,1'-biphenyl-4,4'-diamine), etc.; the material which forms the infrared luminescent layer 23 may be copper phthalocyanine, tris(8-hydroxyquinoline)-erbium, etc.; the material which forms the hole barrier layer 24 may be TPBI (1,3,5-tris(1-phenyl-1H-benzimidazol-2-yl)benzene), BCP (2,9-dimethyl-4,7-diphenyl-1,10-phenanthroline); the material which forms the electron transport layer 25 is substantially transparent for infrared light, and may be, for example, Alq3 (8-hydroxyquinoline aluminum); and the material which forms the cathode 26 is substantially transparent for infrared light, and may be, for example, Mg (magnesium), Ag (silver), or magnesium silver alloy. It is to be indicated that in order to allow infrared light emitted from the infrared luminescent layer 23 to be transmitted towards the side of the light conversion layer 3 and improve the light emission rate of the OLED display apparatus, a reflective layer may be provided on the side of the anode 21 near to the TFT array substrate 1 such that the infrared light transmitted to the side of the TFT array substrate 1 is reflected back to the luminescent structure layer 2 and is finally transmitted to the light conversion layer 3; and the cathode 26 may be made to be extremely thin such that the cathode 26 has more transparent property to minimize the reflection of infrared light by the cathode 26, and infrared light penetrates the cathode 26 and is transmitted to the light conversion layer 3 as much as possible.

EXAMPLE 2

This Example provides a method for producing an OLED display apparatus, and this producing method comprises the following steps.

Figure 3A:
FIGS. 3a-3f are figures of respective steps of a method for producing an OLED display apparatus provided by Example 2 of the present disclosure.

Step S1: as shown in FIG. 3a, producing a TFT array substrate 1. The producing method may be a method known in the art.

Figure 3B:

Step S2: as shown in FIG. 3b, forming a luminescent structure layer 2 on the TFT array substrate 1, wherein the light emitted from the luminescent structure layer 2 is infrared light. The method for forming the luminescent structure layer may be a method known in the art.

Step S3: forming a light conversion layer above the luminescent structure layer, wherein the light conversion layer comprises a plurality of pixel areas, each of which is at least provided with three light conversion units, which are a red conversion unit, a green conversion unit, and a blue light conversion unit. Here, the red light conversion unit is formed of an upconversion luminescent material emitting red light after stimulation by infrared light; the green light conversion unit is formed of an upconversion luminescent material emitting green light after stimulation by infrared light; and the blue light conversion unit is formed of an upconversion luminescent material emitting blue light after stimulation by infrared light. These upconversion luminescent materials are as described in Example 1. The light conversion layer may comprise a black matrix.

Since the upconversion luminescent material for forming the light conversion unit has low price, stable chemical structure, high light-emitting brightness, and good monochromaticity of light emission, the OLED display apparatus produced by the production method provided in this Example has the advantages of low cost, high display stability, high display brightness, and large display gamut.

The Step S3 described above may particularly comprise the following steps.

Figure 3C:
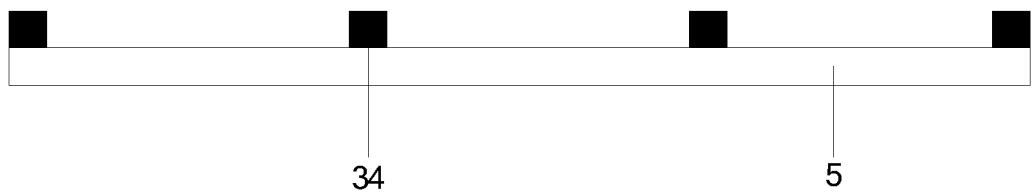

Step S31: as shown in FIG. 3c, forming a black matrix 34 on a base substrate 5 using a patterning process, wherein the black matrix 34 defines the areas where each of the light conversion units to be formed is located. The black matrix is as described in Example 1. A process known in the art may be used as the patterning process, particularly depending on the material used.

Figure 3D:
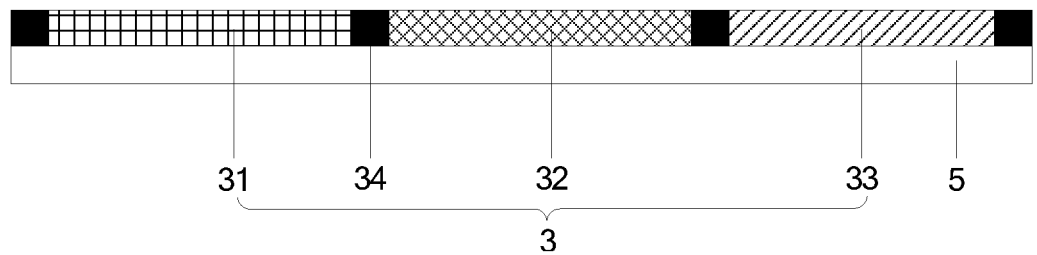

Step S32: as shown in FIG. 3d, forming the red light conversion unit 31, the green light conversion unit 32, and the blue light conversion unit 33 respectively in the areas defined by the black matrix 34 by using a transfer process, a printing process, or a patterning process to allow the black matrix 34 to separate the light conversion units from each other. It is possible to prevent color mixing between lights of different colors and meanwhile shield signal lines, such as gate electrode lines, data lines, etc., on the TFT array substrate. A process known in the art may be used as the transfer process, the printing process, or the patterning process, particularly depending on the material used. The light conversion layer is composed of the black matrix and the light conversion unit.

Step S33: assembling the base substrate with said light conversion layer formed thereon and the TFT array substrate with said luminescent structure layer formed thereon together face to face.

It is to be indicated that since the upconversion luminescent material used in this Example is non-toxic, has stable chemical structure, and is scarcely oxidized with respect to quantum dot materials, the light conversion unit may be formed by using a transfer process, a printing process, or a patterning process, without complex design for encapsulation. It is favorable to simplify the method for producing the OLED display apparatus.

Preferably, in the method for producing the OLED display apparatus provided in this Example, it may be further comprises Step S34, after Step S32 and before S33 described above: as shown in FIG. 3e, forming a protective layer 4 on the light conversion layer 3. The protective layer 4 can prevent the properties of the upconversion luminescent material and the luminescent structure layer 2 in the light conversion layer 3 from being affected due to contamination with each other. Furthermore, since the amounts of red light, green light, and blue light which may be generated by equal amounts of the upconversion luminescent material for emitting red light, the upconversion luminescent material for emitting green light, and the upconversion luminescent material for emitting blue light are not certainly the same, the thicknesses of the red light conversion unit 31, the green light conversion unit 32, and the blue light conversion unit 33 may be required to be different in order to ensure the amounts of lights emitted from the red light conversion unit 31, the green light conversion unit 32, and the blue light conversion unit 33 to be the same. Therefore, the side of the light conversion layer 3 opposite to the base substrate 5 may be not even, and it is favorable to the planarization of the side of the light conversion layer 3 opposite to the base substrate 5 by covering the side of the light conversion layer 3 opposite to the base substrate 5 with the protective layer 4. The protective layer may be formed by using a method known in the art.

Figure 3E:
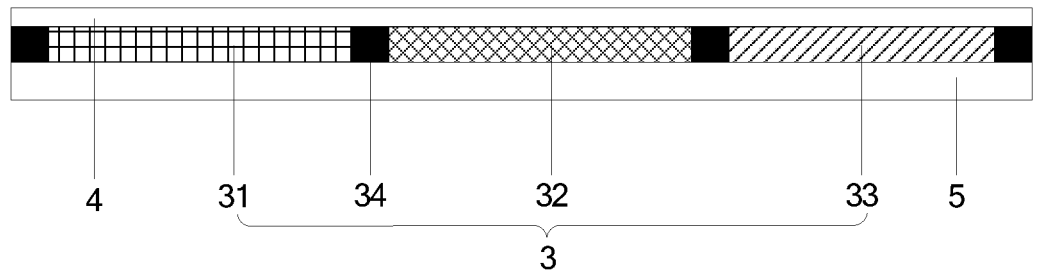
Figure 3F:
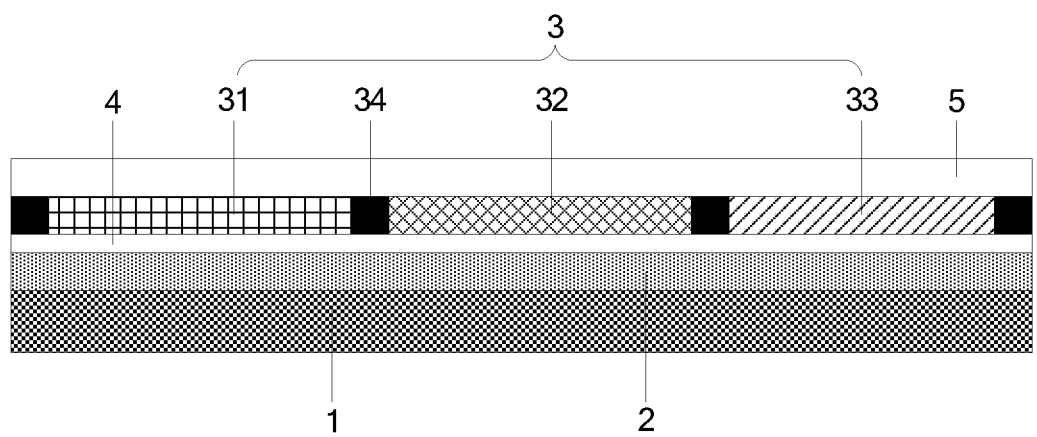

The process for assembling the base substrate 5 with the light conversion layer 3 and the protective layer 4 formed thereon and the TFT array substrate 1 with the luminescent structure layer 2 formed thereon together face to face is as shown in FIG. 3f.

In this Example, the light conversion layer 3 may also be directly formed on the luminescent structure layer 2, and at this point the step of forming the light conversion layer 3 may comprise the followings.

Step S31': forming a black matrix 34 on the luminescent structure layer 2 using a patterning process, wherein the black matrix 34 defines the areas where each of the light conversion units to be formed is located.

Step S32': forming the red light conversion unit 31, the green light conversion unit 32, and the blue light conversion unit 33 respectively in the areas defined by the black matrix 34 by using a transfer process, a printing process, or a patterning process to allow the black matrix 34 to separate the light conversion units from each other.

Based on the solutions for forming the light conversion layer 3 mentioned in above Step S31' and Step S32', it may further comprise a step of forming a protective layer 4 on the luminescent structure layer 2 between Step S2 and Step S3, so as to separate the material in the luminescent structure layer 2 and the upconversion luminescent material in the light conversion unit subsequent formed by using the protective layer 4. In addition, it may further comprise a step of covering the light conversion layer 3 with a base substrate 5 after Step S3, so as to protect the light conversion layer 3 using the base substrate 5.

EXAMPLE 3

This Example provides a color filter substrate, and as shown in FIG. 3e, this color filter substrate comprises: a base substrate 5; a light conversion layer 3 provided on the base substrate 5, wherein the light conversion layer 3 comprises a plurality of pixel areas, each of which is at least provided with three light conversion units, which are a red conversion unit, a green conversion unit, and a blue light conversion unit. Here, the red light conversion unit 31 is formed of an upconversion luminescent material emitting red light after stimulation by infrared light; the green light conversion unit 32 is formed of an upconversion luminescent material emitting green light after stimulation by infrared light; and the blue light conversion unit 33 is formed of an upconversion luminescent material emitting blue light after stimulation by infrared light.

In the color filter substrate described above, red light, green light, and blue light conversion units are formed by using different upconversion luminescent materials. The upconversion luminescent material has low price and stable chemical structure, which is advantageous to reduce the cost of the color filter substrate and improve the stability of light emission. Furthermore, the color filter substrate described above directly emits light by exciting the upconversion luminescent material with infrared, and therefore the light-emitting brightness is high. On the other hand, the light emitted from the upconversion luminescent material, used in the color filter substrate described above, by stimulation has good light monochromaticity, and therefore the display gamut is large. In addition, since the upconversion luminescent material used in the color filter substrate described above is non-toxic, has stable chemical structure, and is scarcely oxidized, the light conversion unit may be formed by using a transfer process, a printing process, or a patterning process and the process of production is very simple.

In order to prevent color mixing between lights of different colors, the light conversion layer 3 may further comprise a black matrix 1. The black matrix 1 defines the areas where each of the light conversion units is located, and is used for separating the light conversion units from each other. In addition, this black matrix 1 is further used to shield signal lines, such as gate electrode lines, data lines, etc., on the TFT array substrate.

In order to prevent the upconversion luminescent material in the light conversion layer 3 from being contaminated, a protective layer 4 may be provided on the light conversion layer 3.

It is to be indicated that the color filter substrate provided in this Example may be used in OLED display apparatuses, but is not limited thereto. In other Examples of the present disclosure, the color filter substrate described above may also be used in liquid crystal type display apparatuses.

EXAMPLE 4

This Example provides a method for producing a color filter substrate, and this method comprises a step of forming a light conversion layer on a base substrate. The light conversion layer formed comprises a plurality of pixel areas, each of which is at least provided with three light conversion units, which are a red conversion unit, a green conversion unit, and a blue light conversion unit. The red light conversion unit is formed of an upconversion luminescent material emitting red light after stimulation by infrared light; the green light conversion unit is formed of an upconversion luminescent material emitting green light after stimulation by infrared light; and the blue light conversion unit is formed of an upconversion luminescent material emitting blue light after stimulation by infrared light.

The color filter substrate produced using the producing method provided in this Example has the advantages of low cost, high stability of light emission, high light-emitting brightness, large display gamut, and simple process of production.

In the producing method provided in this Example, forming a light conversion layer on a base substrate may specifically comprise the following steps.

as shown in FIG. 3c, forming a black matrix 34 on a base substrate 5 using a patterning process, wherein the black matrix 34 defines the areas where each of the light conversion units to be formed is located; and as shown in FIG. 3d, forming the red light conversion unit 31, the green light conversion unit 32, and the blue light conversion unit 33 respectively in the areas defined by the black matrix 34 by using a transfer process, a printing process, or a patterning process to allow the black matrix 34 to separate the light conversion units from each other.

After forming the light conversion layer 3, a protective layer 4 may be further formed on the light conversion layer 3 as shown in FIG. 3e to protect the light conversion layer 3.

Those described above are only specific embodiments of the present disclosure, but the scope of the present disclosure is not limited thereto. Within the technical scope disclosed by this present invention, any person skilled in the art will easily conceive variations or replacements, which should be covered by the scope of the present disclosure. Therefore, the scope of the claims will control with respect to the scope of the present disclosure.

What is claimed is:

1. An OLED display apparatus, comprising:
a TFT array substrate;
a luminescent structure layer provided on said TFT array substrate, wherein light emitted from said luminescent structure layer is infrared light; and
a light conversion layer located above said luminescent structure layer, wherein said light conversion layer comprises a plurality of pixel areas, each of which is at least provided with three light conversion units, which are a red light conversion unit, a green light conversion unit, and a blue light conversion unit; and
the red light conversion unit is formed of an upconversion photoluminescent material capable of exhibiting anti-Stokes effect and emitting red light after stimulation by infrared light;
the green light conversion unit is formed of an upconversion photoluminescent material capable of exhibiting anti-Stokes effect and emitting green light after stimulation by infrared light; and
the blue light conversion unit is formed of an upconversion photoluminescent material capable of exhibiting anti-Stokes effect and emitting blue light after stimulation by infrared light,
wherein all of the upconversion photoluminescent materials capable of exhibiting anti-Stokes effect, which form said red light conversion unit, said green light conversion unit, and said blue light conversion unit, are upconversion nanoparticles.

2. The OLED display apparatus according to claim 1, wherein said light conversion layer further comprises a black matrix, wherein said black matrix defines the areas where each of the light conversion units is located, and is used for separating the light conversion units from each other.

3. The OLED display apparatus according to claim 2, wherein said OLED display apparatus further comprises:
a protective layer located between said light conversion layer and said luminescent structure layer; and
a base substrate located on a side of said light conversion layer opposite to said luminescent structure layer.

4. The OLED display apparatus according to claim 1, wherein said upconversion photoluminescent material capable of exhibiting anti-Stokes effect and emitting red light after stimulation by the infrared light emitted from the luminescent structure layer is an upconversion photoluminescent material capable of exhibiting anti-Stokes effect, which is formed by sintering with NaF as a base material, $Y^{3+}$, $Yb^{3+}$, and $Ce^{3+}$ as doping materials, and glycine as a sintering agent.

5. The OLED display apparatus according to claim 1, wherein said upconversion photoluminescent material capable of exhibiting anti-Stokes effect and emitting green light after stimulation by the infrared light emitted from the luminescent structure layer is an upconversion photoluminescent material capable of exhibiting anti-Stokes effect, which is formed by sintering with NaF as a base material, $Y^{3+}$, $Yb^{3+}$, and $Ho^{3+}$ as doping materials, and citric acid as a sintering agent.

6. The OLED display apparatus according to claim 1, wherein said upconversion photoluminescent material capable of exhibiting anti-Stokes effect and emitting blue light after stimulation by the infrared light emitted from the luminescent structure layer is an upconversion photoluminescent material capable of exhibiting anti-Stokes effect, which is formed by sintering with NaF as a base material, $Y^{3+}$, $Yb^{3+}$, and $Tm^{3+}$ as doping materials, and urea as a sintering agent.

* * * * *